(12) United States Patent
Szanto et al.

(10) Patent No.: US 8,713,082 B1
(45) Date of Patent: Apr. 29, 2014

(54) SCALABLE ARCHITECTURE FOR RANK ORDER FILTERING

(75) Inventors: Peter Szanto, Budapest (HU); Gabor Szedo, Longmont, CO (US); Bela Feher, Budakeszi (HU); Wilson C. Chung, Menlo Park, CA (US)

(73) Assignee: Xilinx, Inc., San Jose, CA (US)

( * ) Notice: Subject to any disclaimer, the term of this patent is extended or adjusted under 35 U.S.C. 154(b) by 488 days.

(21) Appl. No.: 13/180,767

(22) Filed: Jul. 12, 2011

Related U.S. Application Data

(62) Division of application No. 11/713,261, filed on Mar. 2, 2007, now Pat. No. 8,005,881.

(51) Int. Cl.
*G06F 17/10* (2006.01)

(52) U.S. Cl.
USPC .......................................... 708/304

(58) Field of Classification Search
CPC ................. H03H 17/0261; H03H 17/0263
USPC .......................................... 708/207, 304, 445
See application file for complete search history.

(56) References Cited

U.S. PATENT DOCUMENTS

| | | | | |
|---|---|---|---|---|
| 5,138,567 | A | * | 8/1992 | Mehrgardt .................... 708/304 |
| 5,408,675 | A | | 4/1995 | Florentino et al. |
| 5,862,064 | A | * | 1/1999 | Bae et al. ...................... 708/304 |
| 6,687,413 | B2 | | 2/2004 | Yushiya |
| 7,072,921 | B2 | | 7/2006 | Kim |

OTHER PUBLICATIONS

U.S. Appl. No. 11/713,261, filed Mar. 2, 2007, Szanto et al.
Chakrabarti, Chaitali, "High Sample Rate Array Architectures for Median Filters," *IEEE Transactions of Signal Processing*, Mar. 1994, vol. 42, No. 3, pp. 707-712, IEEE, Piscataway, New Jersey, USA.
Chakrabarti, Chaitali et al., "Novel Sorting Network-Based Architectures for Rank Order Filters " *IEEE Transactions on Very Large Scale Integration (VLSI) Systems*, Dec. 1994, vol. 2, No. 4, pp. 502-507, IEEE, Piscataway, New Jersey, USA.
Chakrabarti, Chaitali, "Sorting Network Based Architectures for Median Filters," *IEEE Transactions on Circuits and Systems—II: Analog and Digital Signal Processing,*, Nov. 1993, Vol. 40, No. 11, pp. 723-727, IEEE, Piscataway, New Jersey, USA.
Chang, Long-Wen et al., "Bit Level Systolic Arrays for Real Time Median Filters," *Proc. of the International Conference on Acoustics, Speech, and Signal Processing,*, Apr. 3, 1990, pp. 1791-1794.
Fahmy, Suhaib A. et al., "Novel FPGA-Based Implementation of Median and Weighted Median Filters for Image Processing," *Proc. of the International Conference on Field-Programmable Logic and Applications*, Aug. 24, 2005, pp. 142-147.

(Continued)

*Primary Examiner* — Chuong D Ngo
(74) *Attorney, Agent, or Firm* — W. Eric Webostad

(57) ABSTRACT

A rank order filter and instantiation thereof in programmable logic is described. A maximum filter core frequency is determined for an input sampling frequency, a filter window height, and a number of input samples. The maximum filter core frequency is greater than the sampling frequency. The maximum filter core frequency may be insufficient for a word serial instantiation of the rank order filter in the programmable logic. The size of a fully parallel instantiation of the rank order filter may be excessive in programmable logic. Thus, a partially parallel filter core is instantiated for the rank order filter with overclocking.

6 Claims, 10 Drawing Sheets

(56) References Cited

OTHER PUBLICATIONS

Kar, Barun K. et al., "A New Algorithm for Order Statistic and Sorting," *IEEE Transactions on Signal Processing*, vol. 41, No. 8, Aug. 1993, pp. 2688-2694, IEEE, Piscataway, New Jersey, USA.
Karaman, Mustafa et al., "Design and Implementation of a General-Purpose Median Filter Unit in CMOS VLSI." *IEEE Journal of Solid-State Circuits*, vol. 25, No, 2, pp. 505-513, IEEE, Piscataway, New Jersey, USA, 1990.
Roncella, Roberto, "70-MHz 2-μm CMOS Bit-Level Systolic Array Median Filter," *IEEE Journal of Solid-State Circuits*, vol. 28, No. 5, pp. 530-536, IEEE, Piscataway, New Jersey, USA, 1993.
Szedo, Gabor, *Two-Dimensional Rank Order Filter*, XAPP953 (v1. 0), Aug. 24, 2006, pp. 1-17, Xilinx, Inc., San Jose, California, USA.

\* cited by examiner

SCALABLE ARCHITECTURE FOR RANK ORDER FILTERING

FIELD OF THE INVENTION

One or more aspects of the invention relate generally to integrated circuits and, more particularly, to a scalable architecture for rank order filtering.

BACKGROUND

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex® FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Linear filters, such as Finite Impulse Response ("FIR") and Infinite Impulse Response ("IIR") filters, have known limitations regarding effectively removing impulse-like noises while preserving the edges of an original image. Non-linear filters, such as rank order filters, in contrast may be effective for removing impulse-like noises while preserving the edges of an original image. Accordingly, use of rank order filters may be useful for image pre-processing before edge detection or removing impulse-like transmission noises.

A rank order filter conventionally orders contents of a filter kernel ("window") and selects a sample indexed by rank. Conventionally, samples are rank ordered according to magnitude. A sample or pixel with a target rank may be selected for output. For example, the sample with a target rank may replace a center sample in such filter window in a filter output. Examples of ranks include median, minimum, and maximum, among other known examples of ranking. Thus, for these three specific examples, the median value, the minimum value, and the maximum value, respectively, would be selected in each of the different types of rank ordering for output from a rank order filter. Thus, it should be appreciated that sample size may affect image quality.

Accordingly, it would be desirable and useful to provide a scalable architecture for rank order filters extended to two-dimensional ("2D") filters for image and video processing.

SUMMARY

One or more aspects of the invention generally relate to integrated circuits and, more particularly, to a scalable architecture for rank order filtering.

An aspect of the invention relates generally to a rank order filter. A delay line is coupled to receive pixel information. A filter core is coupled to receive at least a portion of the pixel information. The filter core includes: a first stage of registers for registering data, where the first stage of registers is configured as a first shift register for shifting the data in the filter core; a comparator stage coupled to receive output from the first stage of registers and configured to compare a newly registered portion of the data registered in the first stage of registers with each previously registered portion of the data registered in the first stage of registers to provide comparison results; a second stage of registers coupled for receiving and configured for registering the comparison results; a third stage of registers coupled for receiving the comparison results; a first register portion of the third stage of registers configured to invert the comparison results, to register the comparison results inverted as first Most Significant Bits, and to include a first Least Significant Bit as a self-compare bit, where the first register portion is configured for providing a first output including the first Most Significant Bits and the first Least Significant Bit; a second register portion of the third stage of registers coupled to the first register portion of the third stage of registers as a shift register, where the first register portion is coupled to the second register portion to shift first Least Significant Bits of the first register portion into the second register portion as second Most Significant Bits; and a conversion stage coupled to receive a rank value, the first output and a second output. The first Least Significant Bits include the first Least Significant Bit. The second register portion is coupled to receive a comparison result of the comparison results as a second Least Significant Bit to provide the second output. The second register portion is configured for providing the second output including the second Most Significant Bits and the second Least Significant Bit. The conversion stage is configured to bit sum each of the first output and the second output for respectively generating a first value and a second value. The conversion stage is configured to compare each of the first value and the second value to the rank value for generating a one-hot result. The conversion stage is configured to convert the one-hot result to an associated address. The address is associated with a portion of the data in the filter core associated with the one-hot result. The delay line is coupled to receive the address for accessing the pixel information associated with the one-hot result.

Another aspect of the invention generally relates to a method for instantiating a rank order filter in programmable logic. A maximum filter core frequency is determined for a filter window width, a filter window height, and a number of input samples. The maximum filter core frequency is greater than the sampling frequency times the filter height divided by the number of new samples. The maximum filter core frequency is insufficient for a word serial instantiation of the rank order filter in the programmable logic. The maximum filter core frequency is excessive for a fully parallel instantiation of the rank order filter in the programmable logic. A partially parallel filter core is instantiated for the rank order filter. The partially parallel filter core is configured to process multiple new samples at one clock cycle, and complete the processing of window height number of samples in one or more clock cycles of the maximum filter core frequency and for producing a single address output on each clock cycle of the maximum filter core frequency.

Yet another aspect of the invention relates to a rank order filter associated with a virtual filter window. The virtual filter window is a number NZ+1 concatenated real filter windows. The number NZ is a height of the virtual filter window minus a height of the real filter windows, wherein each of the real filter windows are of a same dimension. A filter core includes a stage of data registers, a stage of comparison blocks configured for registering compare results, and a stage of shift registers. The virtual filter window is configured to accommodate an integer multiple input of NI samples to the filter core. The filter core is configured for input of the NI samples on a clock cycle of a filter core clock. The filter core inputs the integer multiple of the NI samples for a number of clock cycles of the filter core clock, where the number of the clock cycles is equivalent to the integer multiple. The virtual filter window spans padding samples, and the padding samples are capable of being part of the NI samples. The NI samples are capable of including both real samples and the padding samples, where the real samples are associated with actual pixel information. The filter core is configured to make available all of the compare results for the stage of shift registers for generating NZ+1 outputs on each clock cycle of the filter core clock.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

In the following description, rank order filtering is described for a one-dimensional ("1D") embodiment, which may be extrapolated for implementing a 2D rank order filter. For a 2D filter window, the filter window may be moved across an image, where contents within such filter window are filtered using rank ordering. For example, such a 2D window may be shifted by one pixel at a time across an image, and after filtering a line, such a 2D window may be shifted down one row at a time for filtering each line of an image.

As the 2D filter window is of a fixed size, this shifting may mean that contents within such 2D window at a prior instant of time may be discarded in favor of contents added or inserted at a subsequent instant in time. Accordingly, each time such a 2D filter window is moved across an image, a set of new pixel information may be used for rank ordering, and a set of old pixel information may be discarded. Additionally, it should be appreciated that filter windows may overlap and that an image may be padded, namely having padding pixels which extend beyond the size of the image. Notably, a difference between 2D and 1D rank order filtering, other than amount of TAPs, is that an entire column of pixel samples within a filter window from an image may be inserted into a 2D filter core for each new output sample.

Figure 1:
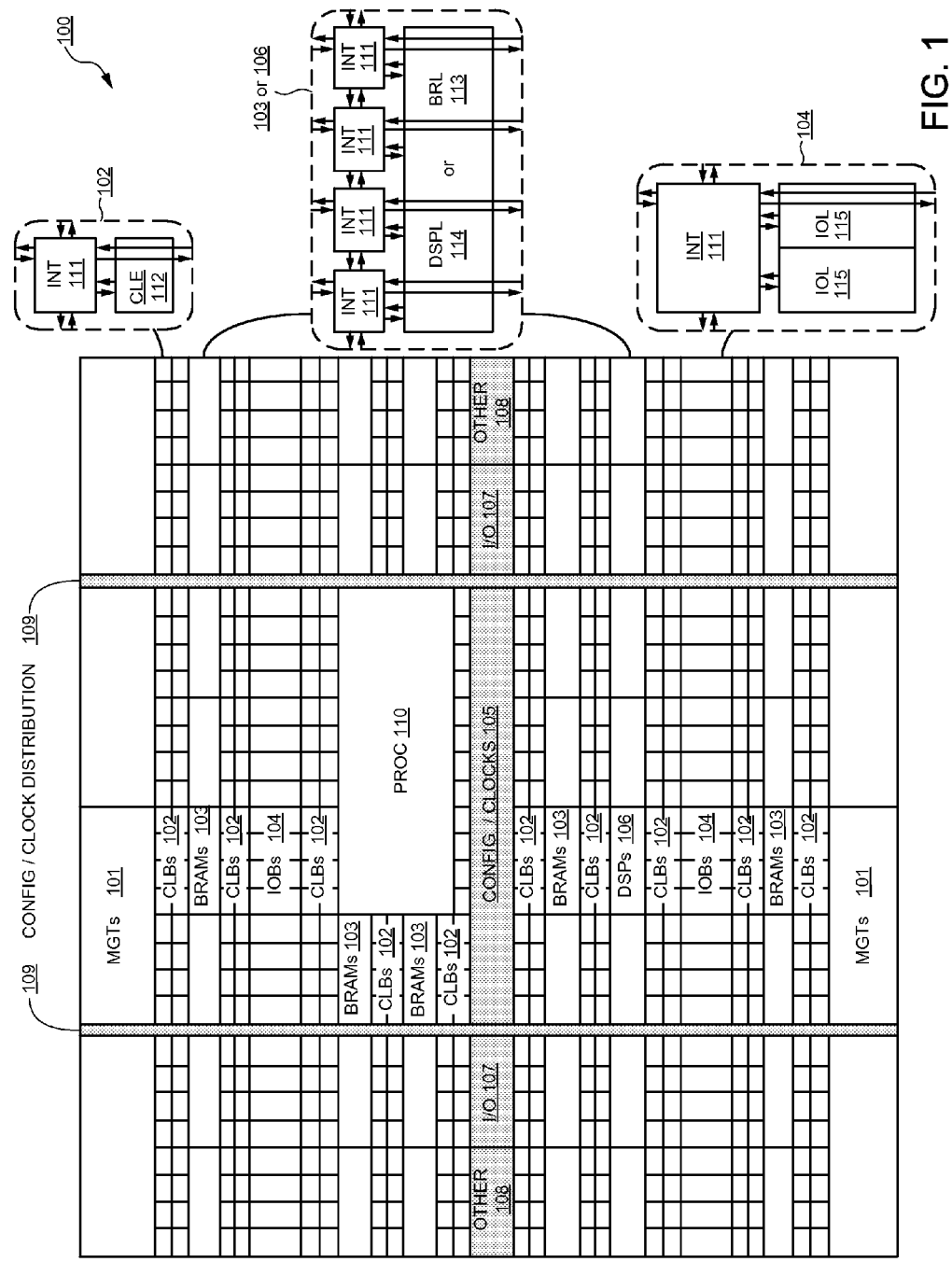
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ or Virtex-5™ FPGA from Xilinx of San Jose, Calif.

The following description discloses conversion of a 1D rank order filter structure to a 2D rank order filter, which may be used for image and video processing. Such rank order filters are configured to select a sample with a pre-defined index from a magnitude-ordered list of input samples. Examples of such pre-defined indexes may include median, minimum, and maximum, among other known types of rank ordering. Additionally, although the example of pixels are used as being samples, it should be understood that other data points may be used depending upon the application.

Figure 2A:
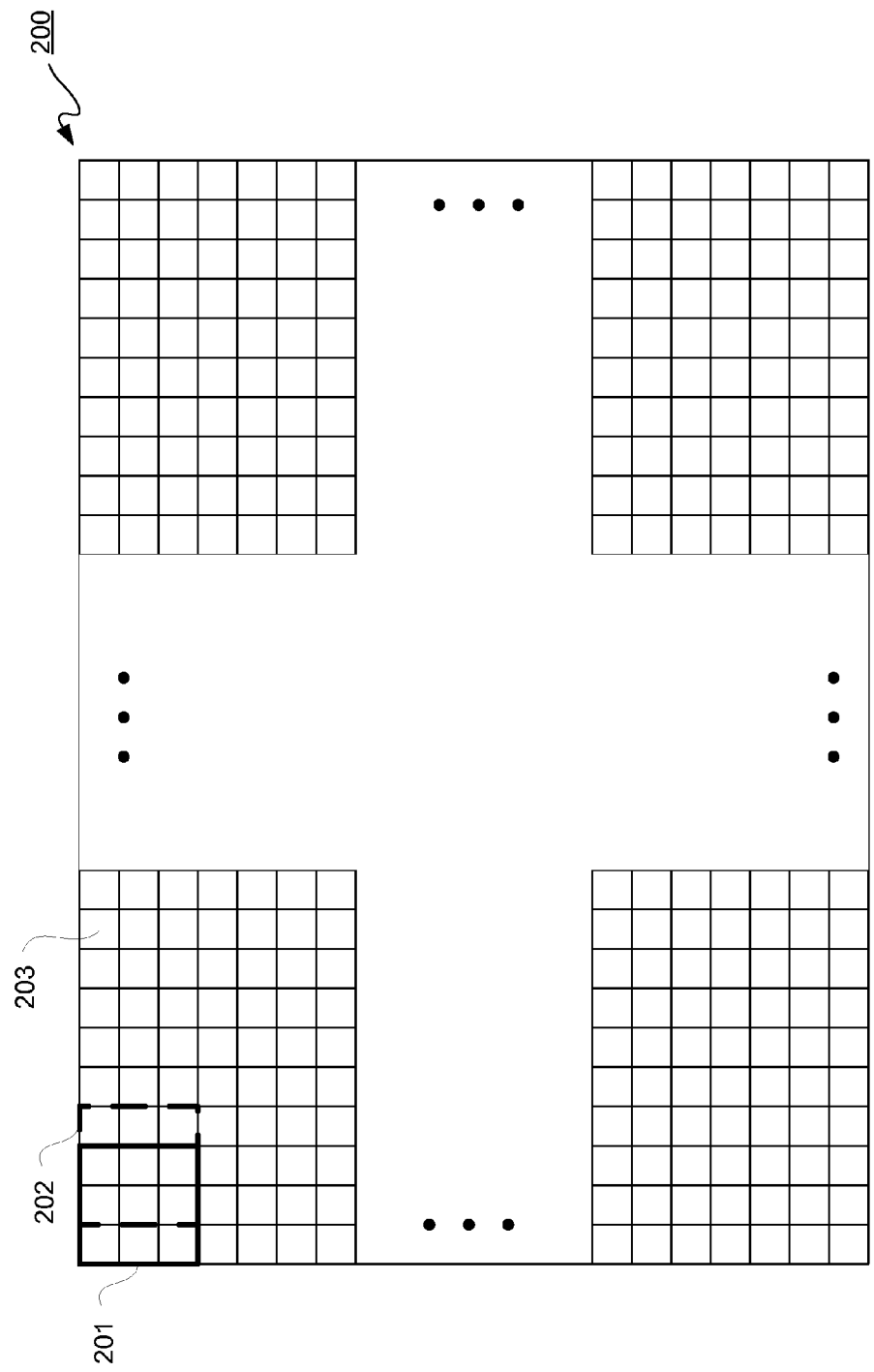
FIG. 2A is a block diagram depicting an exemplary embodiment of an image frame.

FIG. 2A is a block diagram depicting an exemplary embodiment of an image frame 200. Image frame 200 may comprise an array of pixels 203, as is known. A filter window 201 may be progressively moved across image frame 200 as indicated by dashed line 202. Filtering window 201 is a 2D filtering window having a window width ("WW") and a window height ("WH") which respectively are horizontal and vertical dimensions of filter window 201.

In this particular example, filter window 201 is three pixels for WW and three pixels for WH. However, other dimensions other than a three pixel-by-three pixel ("3-by-3") window may be used. For a 3-by-3 pixel filter window, a filter core may have NTAP=9, where NTAP is the number of TAPs in the rank order filter. Thus, the number NTAP of a filter core is generally equivalent to the number of samples of a filter window.

A data width ("DW") parameter denotes the width of a complete set of pixel information on a per-pixel basis. For example, DW may denote the data width of a complete set of Red, Green, and Blue ("RGB") color values for a pixel. A data width filter ("DWF") parameter denotes the width of data used for ordering. The DWF value or parameter is the width of the pixel information passed to filter core 304 of FIG. 3, which is described in additional detail below.

In many applications, a user may order pixels according to luminance ("Y") magnitude. If the input information is in a YCbCr or YUV (i.e., Luminance Chrominance-blue Chrominance-red or Luminance-Chrominance) color space, the Y value for each pixel may be easily obtained. If, however, the input is in the form of RGB component values, then the Y value for each pixel may be derived from such RGB component values. Notably, to derive luminance values Y from RGB components, a color-space conversion module or similar block may be used, namely a Filter Value Generator ("FVG") or Y generator may be used for such conversion.

To generate a new output sample, WH samples, which in the example of FIG. 2A is 3, are inserted from image 200 into filter window 201 by moving filter window 201 one pixel to the right. Of course, this assumes that image frame 200 is filtered horizontally; however, it should be appreciated that other known types of shifting may be used. Furthermore, generally a filter window in one clock cycle overlaps such filter window in a next clock cycle by at least one column of pixels due to a one column shift to the right; however, other known types of shifting may be used. For purposes of clarity and not limitation, it shall be assumed that scanning of image frame 200 is done from left to right and from top to bottom, using a rectangular, including without limitation a square, filter window. Notably, it should be understood that for 2D rank order filtering, multiple samples are input into a filter in a clock cycle in order to generate a single associated output.

Figure 2B:
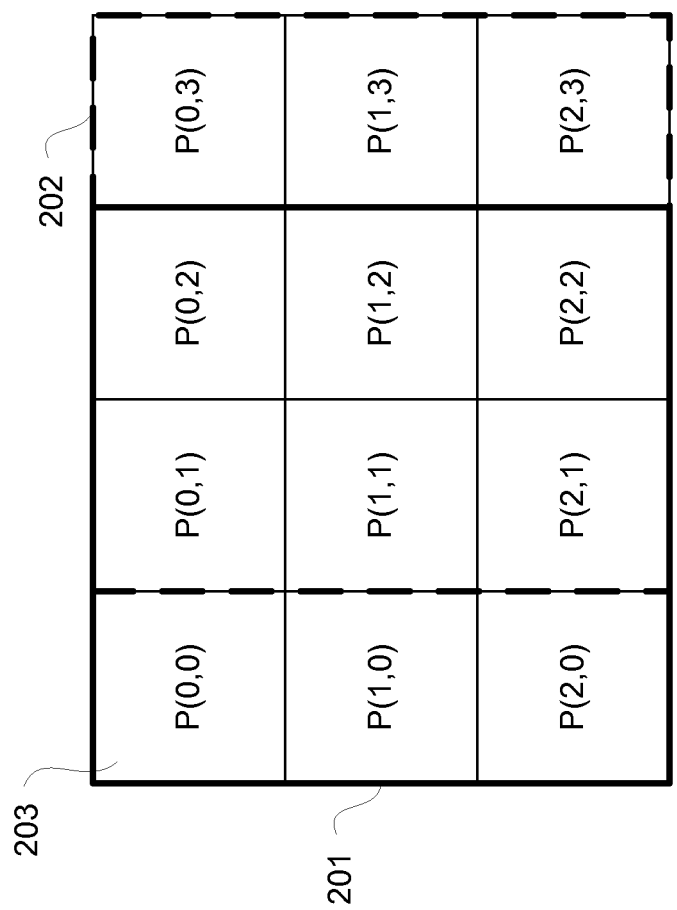
FIG. 2B is an excerpt of FIG. 2A for a filtering window.

FIG. 2B is an excerpt of FIG. 2A for filtering window 201. In this example, pixels P(0,0), P(0,1), P(0,2), P(1,0), P(1,1), P(1,2), P(2,0), P(2,1), and P(2,2) in filtering window 201 are sampled during one sample cycle, and on a subsequent sample cycle, pixels P(0,0), P(1,0), and P(2,0) are discarded from the sample set and pixels P(0,3), P(1,3), and P(2,3) are added to the sample set of filtering window 201 as indicated with dashed line 202.

To extend a 1D rank order filter to a 2D rank order filter operation, the 2D rank order filter may be overclocked at a WH multiple of a pixel clock ("WH clock"). A new set of input pixels, such as pixels P(0,3), P(1,3) and P(2,3), may be read every pixel clock cycle for input into a filter, but a valid output pixel may be generated once in each WH clock cycle. Thus, pixels may be processed in a filter core of a rank order filter at a WH clock rate.

For the example of implementation of rank order filters as described herein in an FPGA, it should be appreciated that the frequency of a filter core of a rank order filter may be prohibitively high, except that there are multiple resources available in such an FPGA to allow parallel filtering. Accordingly, by using multiple instances of filter components in parallel, such a filter may accept WH input samples in every pixel clock cycle for processing at a WH clock rate.

By parallelizing and overclocking as described herein, rank order filtering may input a number of new input samples for each pixel clock cycle and generate a single new output sample using an overclocked-parallelized hybrid rank order filter. For example, pixel line resolution of 1080 progressive for a High Definition Television ("HDTV") signal of 75 MHz is still relatively low compared to an operating frequency that may be implemented in some FPGAs, such as FPGAs available from Xilinx, Inc., of San Jose, Calif. Accordingly, in those FPGAs, a fully parallel implementation may be suboptimal due to inefficient resource utilization. Therefore, in FPGAs that are not sufficiently fast compared to the pixel clock frequency, a fully parallel implementation may be used; however, in implementations where pixel clock frequency is relatively slow compared to the operating frequency of the FPGA, a hybrid solution may be used.

A hybrid rank order filter may span the variety of implementations between a fully parallel implementation and a word serial implementation. Again, in a fully parallel implementation, WH input samples are input to the filter per each pixel clock cycle, where WH is an integer value greater than one pixel, and in a word serial implementation, one input sample is input to the filter per pixel clock cycle. Thus, a hybrid rank order filter allows tuning or scaling of a filter core for parallel resource usage at a clock frequency allowed by a target host integrated circuit, such as an FPGA. To determine a filter core operating frequency ("$f_c$"), the following equation may be used:

$$f_c = f_s WH/NI,  \quad (1)$$

where $f_s$ is a sampling frequency of an input, namely in this example the pixel clock frequency, and NI is a number of new input samples added on each sampling frequency, $f_s$, clock cycle. For a fully parallel implementation, NI equals WH, and thus $f_c$ equals $f_s$. However, for a hybrid implementation, NI is less than WH. For a hybrid implementation, $f_c$ may be maximized for overclocking to reduce resource count as described below in additional detail. Stated another way, NI is to be greater than the ratio of $f_s$ to $f_c$ multiplied by WH.

Figure 3:
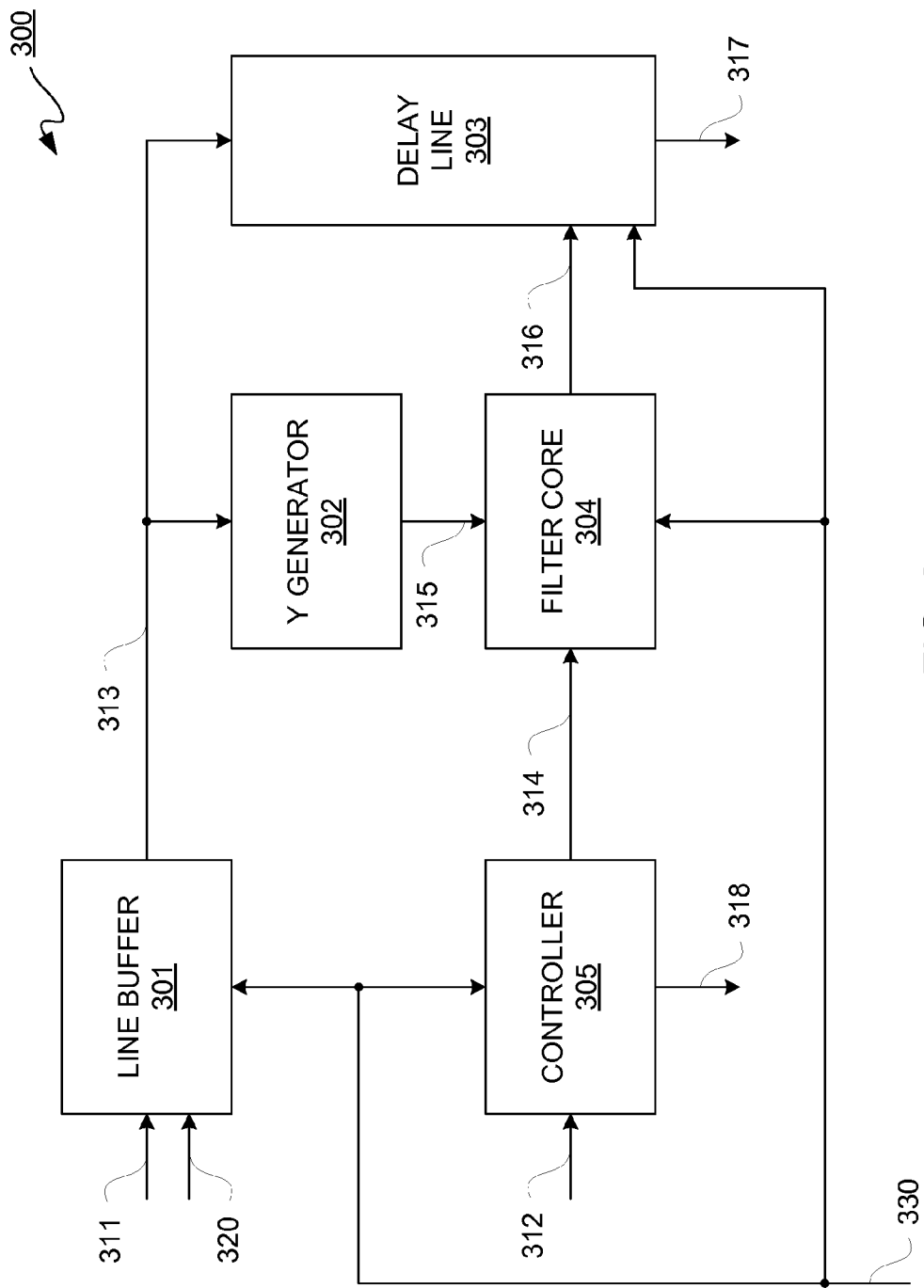
FIG. 3 is a block diagram depicting an exemplary embodiment of a rank order filter.

FIG. 3 is a block diagram depicting an exemplary embodiment of a rank order filter 300. Rank order filter 300 includes line buffer 301, optional FVG or Y generator 302, delay line 303, filter core 304, and controller 305.

With continuing reference to FIG. 3, it should be appreciated that line buffer 301 may buffer pixel information for multiple pixels for entire lines of a frame. For example, if a window size was 7-by-7 pixels, line buffer 301, using a line-by-line or row-by-row processing protocol, may buffer at least six lines of a frame before receiving the seventh line of such frame. After receiving pixel information for seven pixels on the seventh line, a complete window may be processed, and windows may be processed thereafter with continued buffering of pixel information. Furthermore, for this example, if a column of WH pixels is input, then immediately after the seventh pixel on the seventh line is received, processing using such filter window may begin.

Information may be clocked into line buffer 301 at a first data rate and clocked out of line buffer 301 at a second data rate which is much faster than the first data rate, namely faster than the data rate at which information is clocked into line buffer 301. For example, line buffer 301 may have information clocked into it responsive to a pixel clock 320. It should be appreciated that even operating at 75 MHz, pixel clock 320 may be significantly slower than a system clock signal 330. For example, system clock signal 330 may be more than five times the frequency of pixel clock 320. Accordingly, information clocked out of line buffer 301 may be clocked at a much faster rate than information clocked into line buffer 301.

System clock 330 may be provided to filter core 304, line buffer 301, delay line 303, and controller 305, for synchronizing operation of rank order filter 300. Delay line 303 may have NTAP delay stages, and filter core 304 may have NTAP registers in a data register stage, as well as NTAP registers in a corresponding shift register stage, as described below in additional detail. Notably, for purposes of clarity and not limitation, it has been assumed that a system clock signal frequency is used as the core frequency for a WH clock signal; however, a WH clock signal which is slower than the system clock signal may be used. Furthermore, for purposes of clarity and not limitation, it has been assumed that the system clock signal 330 has a frequency which is a WH integer multiple of pixel clock 320 frequency, namely the sampling frequency.

Depending on horizontal resolution of a frame and vertical size of a filter window, line buffer 301 may be implemented using either on-chip or off-chip memory resources with respect to implementation using an FPGA, such as FPGA 100 of FIG. 1. For a maximum number of pixels per line being L, the number of bits stored by line buffer 301 may be determined using:

$$DW(WH-1)L. \quad (2)$$

For example, for an HDTV 1920 pixel line resolution and a 7-by-7 pixel filter window size, line buffer 301 may be implemented using BRAMs of an FPGA to store 34,560 bytes, as 1920×(7−1)×3=34,560, assuming there are three bytes of color data for each pixel.

Line buffer 301 receives pixel input 311. Line buffer 301, configured to store approximately (WH−1) lines of an input image frame of pixel input 311, outputs color values 313 as part of a filter window, as described above. Notably, if color values 313 are for RGB pixel information, Y generator 302 is used. If, however, color values 313 are YCbCr or YUV color space values, then Y generator 302 may be omitted, or such Y information in color values 313 may merely flow through Y generator 302 to filter core 304 in a bypass mode. Notably, color values 313 output from line buffer 301 may be the full pixel information for providing to delay line 317; however, input to filter core 304 may be only the Y value of sampled pixels.

For purposes of clarity and not limitation, it will be assumed that color values 313 are RGB values. RGB values 313 are provided to Y generator 302 and to delay line 303. Delay line 303 may be configured to store full pixel information, namely all three color components, for pixels currently being processed by rank order filter 300 or more particularly by filter core 304 of rank order filter 300. Filter core 304 of rank order filter 300 is configured to do rank filtering.

Controller 305 receives control input 312 and provides control output 318 and rank value ("rank") signal 314. Controller 305 may be configured to generate optional data switching, masking, or output valid signals as part of control output 318.

Again, image frames need not be filtered using a full set of RGB color values. Rather, a function of the RGB color values, such as luminance may be used. As luminance uses fewer bits than RGB color values, fewer bits may be passed to filter core 304 than full pixel information. Accordingly, full pixel information for pixels being processed by filter core 304 may be stored in an addressable buffer, which in this example is implemented as a delay line 303, and such addressable buffer may be accessed by addresses generated using luminance values. Accordingly, filter core 304 outputs an address 316 which is provided to delay line 303. For an FPGA implementation using a Xilinx FPGA, SRL 16 and SRL 32 primitives may be used for such an addressable buffer.

With pixel information for pixels being processed by filter core 304 stored in delay line 303, datapaths within filter core 304 may be streamlined. Again, filter core 304 produces an address 316 for delay line 303 to access full pixel information, which in this example is RBG information, for filter output 317. The number of pixels stored by delay line 303 may be the sum of a filter size, namely the number of TAPs, or NTAP, plus the clock cycle latency of filter core 304. Thus, for the example of a 7-by-7 pixel window, and a clock cycle latency of 12, the number of pixels stored by delay line 303 may be 61.

Again, Y generator 302 is an optional module of rank order filter 300, as it is used only when input format of pixel input 311 is not suitable for direct luminance rank order filtering. For YCbCr or YUV input representations of pixel input 311, Y generator 302 may be omitted, as the Y component in YCbCr or YUB input representations lends itself directly for rank ordering. However, continuing the above example of pixel input 311 being RGB input, luminance may be calculated. Accordingly, Y generator 302 may be configured to generate a Y component as follows:

$$Y'=0.299R+0.587G+0.114B. \quad (3)$$

Notably, as Y information is used only to rank order pixels, Y generator 302 may be simplified by calculating an actual Y value as follows:

$$Y=0.50989R+G+0.19421B. \quad (4)$$

Complexity and latency associated with Y generator 302 need not change the architecture of rank order filter 300. Accordingly, arbitrary algorithms may be implemented to provide a luminance summation of RGB component values. This summation of RGB component values may be used for color space conversion by Y generator 302 to provide luminance signal 315 input to filter core 304. The number of Y generator modules used in rank order filter 300 may be the same as the number of new input samples, namely NI as described above. Accordingly, even though only single blocks are illustratively shown in FIG. 3, it should be appreciated that these single blocks may represent multiple blocks scaled to a target degree of parallelism.

Rank signal 314 input to filter core 304 indicates a target rank value. This target rank value is for selecting a luminance of a pixel in ranking of luminance signal 315 input to filter core 304. Filter core 304 in response provides an address 316 to delay line 303. Address 316 indicates the address of the pixel having the luminance selected by filter core 304.

Filter core 304 may be clocked with reference to a system clock 330 along with delay line 303 in order for synchronous operation between filter core 304 and delay line 303. Address 316 indicates which of the color values 313 presently in delay line 303 is to be output as filter output 317.

Assume that filter core 304 includes a number of TAPs, namely NTAP, of different samples. Each sample in filter core 304 may be associated with an index value representing the number of samples smaller than a corresponding sample. Thus, fore each new sample inserted into a filter window, samples already in filter core 304 may be compared with such inserted sample. Based on such comparisons, index values may be updated resulting in distinct values ranging from 1, namely a smallest sample, to NTAP, namely a largest sample, at any time. As new samples enter rank order filter 300, samples already in rank order filter 300 are shifted along with their corresponding index values, which are updated as values are shifted in and out.

Figure 4:
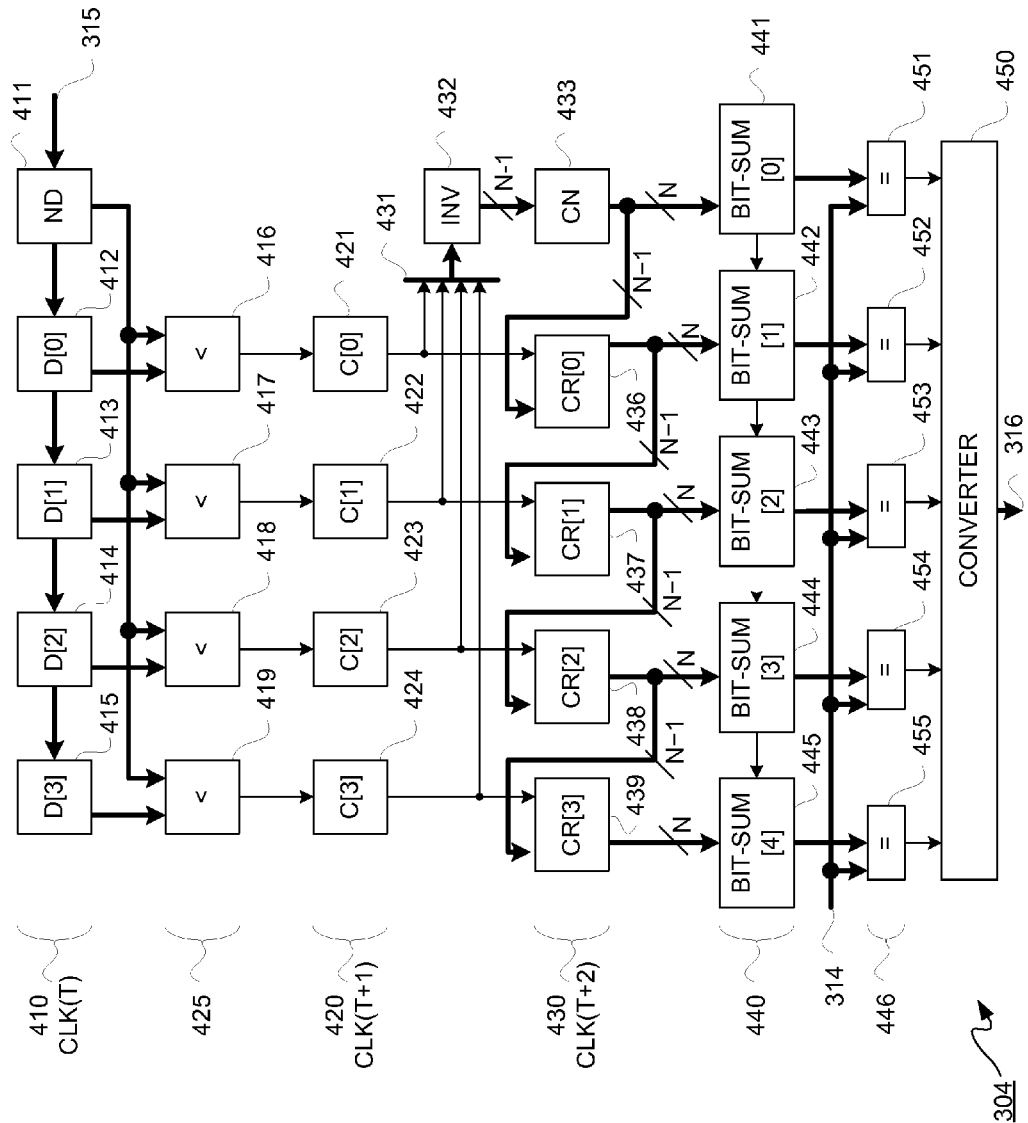
FIG. 4 is a block diagram depicting an exemplary embodiment of a filter core.

FIG. 4 is a block diagram depicting an exemplary embodiment of a filter core 304. In this example of filter core 304, NTAP is equal to 5. Notably, other sizes may be used for the number of TAPs. Thus, if a filter window was 7-by-7, NTAP would equal 49, and thus a chain of 49 data registers for example may be implemented.

However, in this example, NTAP is equal to five, so there are four data registers 415, 414, 413, and 412 for storing previous data samples D[3 . . . 0], respectively, and an input data register 411, which in FIG. 4 is labeled "ND" for new data, namely a total of 5 data registers. Register 411 receives Y values via signal 315. Registers 411 through 415 are coupled in a series, where registers 412 through 415 respectively store previous data samples D[0] through D[3]. Each older sample in registers 412 through 415 is compared with a recently received sample from register 411. Thus, registers 411 through 415 may be considered a first register stage or first pipeline stage 410. For NTAP equal to five, once a sixth data point in a sequence is input, the first data point in such sequence is in effect shifted out of filter core 304, or more particularly overwritten in data register D[3] 415.

Notably, system clock 330 of FIG. 3 may be used for clocking registers of filter core 304, but is omitted in FIG. 4 for purposes of clarity and not limitation. Thus, generally, register stage 410 may be associated with a clock cycle time T of system clock signal 330.

Output of registers 412 through 415 is respectively provided to comparators 416 through 419 of comparison stage 425. Output of register 411 is provided to each of comparators 416 through 419 for comparison with respective outputs from registers 412 through 415. It should be appreciated that registers 411 through 415 and comparators 416 through 419 may be coupled for receiving multiple bits in parallel; however, output of comparators 416 through 419 may each be a single bit output.

Values stored in registers 412 through 415 are samples to be ordered, and such filter values are compared with new data of register 411 to determine whether, for example, such new sample is greater than the previously stored samples in registers 412 through 415. Notably, depending on the implementation, something other than a greater than comparison may be used, such as a less than comparison.

Results of comparisons by comparators 416 through 419 are respectively provided to registers 421 through 424 to store comparison results C[0] through C[3], respectively. Registers 421 through 424 may be considered a second register stage or second pipeline stage 420 at a clock cycle time of T+1 clock cycle, or more generally clock T+1, of system clock signal 330.

Each comparison result stored in second register stage 420 is respectively provided to an inversion stage or inverter 432 through bus 431. Furthermore, outputs of registers 421 through 424 are respectively provided to registers 436 through 439. Registers 436 through 439 provide a third register stage or third pipeline stage 430, which generally may be thought of as being at clock cycle time T+2 of system clock signal 330. Registers 436 through 439 each are NTAP-bits wide registers for storing comparison results ("CR"), namely registers CR[0] through CR[3], respectively.

Filter core 304 may have its registers each initialized with a value of zero. Furthermore, once a first data point is registered in a last register of a third register stage 430, which is register CR[3] 439 in this example, filter core 304 has a two clock cycle latency.

Output of comparators 416 through 419 are each a single bit output. With reference to a window of pixels, it is not necessary to retain the value of the luminance Y for such pixels; rather, knowledge of where, namely which pixel, in the window has the target ranking is sufficient. Thus, it should be appreciated that information with respect to the actual magnitude of the luminance is lost with regard to the output from comparator stage 425, and rather the remainder of filter core 304 is for generating an address in association with the pixel having the target luminance value for a target rank.

Third register stage 430 may be thought of as a shift register. Inverted output from inversion stage 432 is provided to compare new ("ON") register 433. Input to compare new register 433 is (N−1) bits wide, which in this example is 4 bits. Output of compare new register 433 to CR[0] register 436 are these (N−1) inverted bits shifted over one position to the left plus the addition of a logic 1 LSB. The addition of a logic 1 LSB is a self-comparison LSB, as described below in additional detail. Single LSBs for registers 436 through 439 are respectively provided from registers 421 through 424.

The MSBs for registers 436 through 439 are provided from respective prior registers of register stage 430. Thus, for example, an (N−1)-bit wide output of compare new register 433 is provided as the MSBs to register 436. However, an N-bit wide output from compare new register 433 is provided to bit-sum block [0] ("bit summer") 441 of bit summing stage 440. Bit summing stage 440 in this example includes bit summers [0] through [4], namely respectively bit summers 441 through 445. An N-bit wide output of register 436 is provided to bit summer 442, and an (N−1)-bit wide output of register 436 is provided to register 437 as the MSBs. Similarly, an N-bit output of register 437 is provided to bit summer 443 and an (N−1)-bit output of register 437 is provided to register 438 as the MSBs. An N-bit output of register 438 is provided to bit summer 444 and an (N−1)-bit output of register 438 is provided to register 439 as the MSBs. An N-bit output of register 439 is provided to bit summer 445.

Thus, the LSBs are provided from compare results to each of the registers in the shift register chain, except providing all such compare results inverted to CN register 433 in order to provide MSBs to an initial register of the shift register chain, namely register 436 of register stage 430. The bits of comparators CR[3 . . . 0] are respectively propagated from C and CR registers such that:

$$CR[k]=\{CR[k-1](NTAP-2:0), |C[k]|\} \quad (5)$$

where (:) denotes bit selection and { } denotes concatenation. Thus, bits of CR registers are updated using previous CR registers in accordance with Equation (5) where k indicates a data position, which in this example is anywhere from 0 to 3. Consequently, at any given time, data register D[k] with its associated shift register CR[k] stores an input sample and all comparison results of this input sample with other input samples residing in filter core 304.

By counting the number of logic 1 bits from each register in third register stage 430, namely registers 433 and 436 through 439, index information may be generated. In other words, the number of logic 1s in a register of third register stage 430 indicates the number of samples in filter core 304 which are smaller than the given sample. Register 433 effectively is an update mechanism for register stage 430, as register 433 uses the inverted results of all comparisons. In other words, bits of register 433 are updated with the inverted result of comparator bits, and a bit 0, or the LSB, of register 433 is initialized with a logic 1 as a preset self-compare outcome.

Bit summers 441 through 445 respectively sum the number of logic 1s in each of the outputs respectively from registers 433, 436, 437, 438, and 439. Output of such bit summing is fed forward and provided to equality stage 446. Also provided to equality stage 446 is a rank value from rank signal 314.

More particularly, the sum of logic 1s from each of bit summers 441 through 445 are respectively provided to equality blocks 451 through 455. Provided as an input to each of equality blocks 451 through 455 is rank signaling 314 which indicates a target rank for which equality is sought. Furthermore, the value of each bit summer 441 through 444 is provided to a respective adjacent bit summer 442 through 445, which in this example is the adjacent bit summer on the left. Output of equality blocks 451 through 455 is provided on a bit-by-bit basis to converter 450. In this particular example, converter 450 is a one-hot 5-to-1 converter. Converter 450 responsive to such input from equality stage 446 provides address signal 316 for delay line 303 of FIG. 3.

It should be appreciated that the output of each equality block 451 through 455 is a single bit, which indicates whether or not a match with a rank input from rank signal 314 has been found. Notably, in this example implementation, only one of equality blocks 451 through 455 at a time is equal to the rank value provided from rank signal 314 and one of the values from third stage registers 430 will exactly equal this rank value. Hence, output from equality stage 446 in this example is a "one hot" output. The "one hot" output from equality stage 446 may be converted to a binary address by converter 450.

Even though an exact match between a rank value and a generated index value has been described, it should be appreciated that a closest match of a generated index value to an input rank value may be used. Alternatively, no rank value need be input and either a largest or a smallest generated index value may be selected. Accordingly, it should be appreciated that any of a variety of rank selection algorithms may be implemented.

Figure 5:
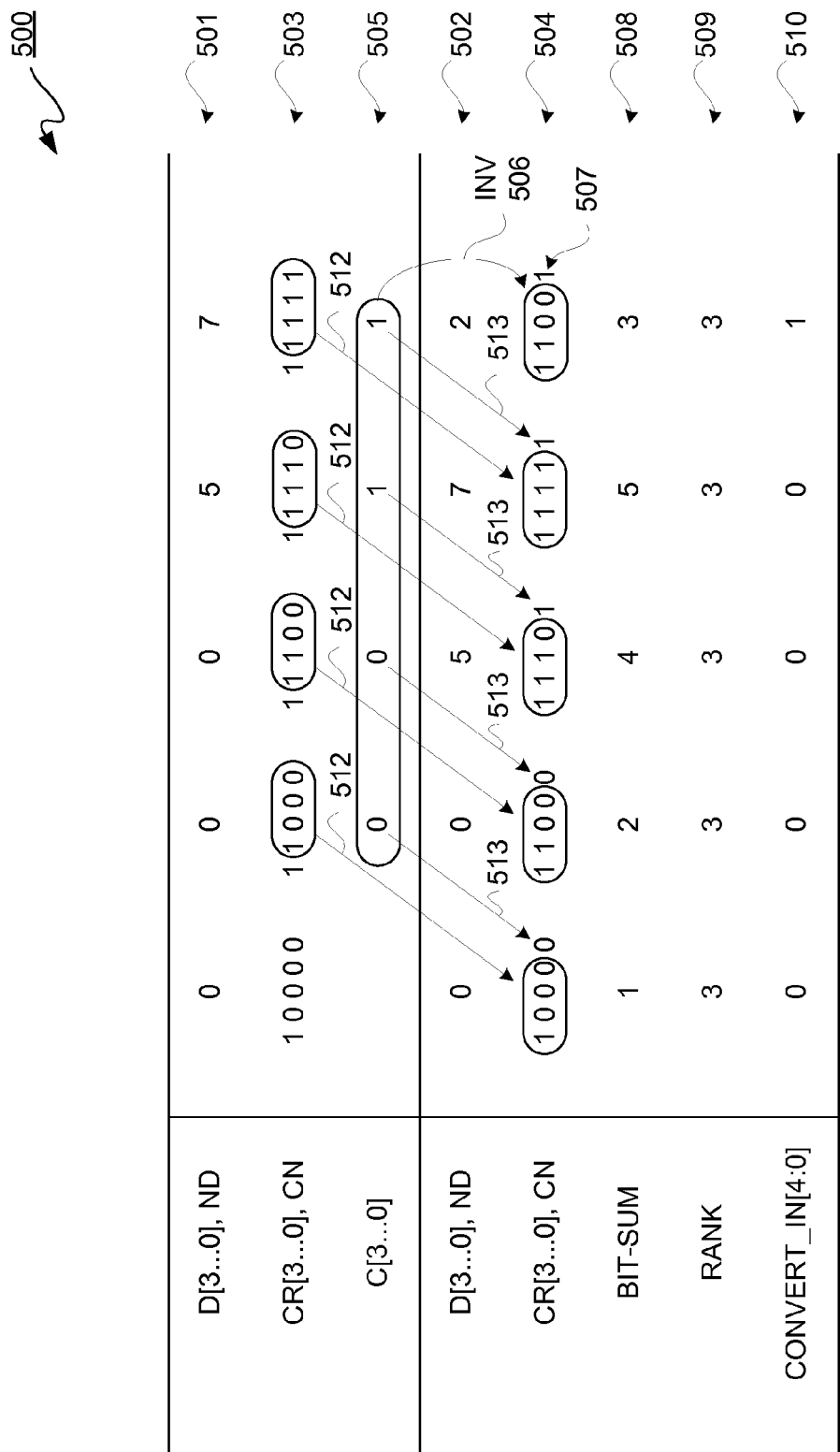
FIG. 5 is a data flow diagram depicting an exemplary embodiment of a data flow through the filter core of FIG. 4.

FIG. 5 is a data flow diagram depicting an exemplary embodiment of a data flow 500 through filter core 304 of FIG. 4. With reference to FIGS. 4 and 5, data flow 500 is further described. Filter core 304 has data values ("D[3 . . . 0], ND") 0, 0, 0, 5, and 7 for data registers 415 through 411, respectively, on one clock cycle as generally indicated by line 501, and on a subsequent clock cycle a new data value or new input sample of 2 is entered as generally indicated by line 502.

With respect to comparison results ("CR[3 . . . 0]") of third register stage 430, four LSBs from each of registers 433 and 436 through 438 for one clock cycle are stored as MSBs in registers 436 through 439, respectively, on a next clock cycle, as generally indicated by lines 503 and 504 and by arrows 512. For an input sample 2, as indicated on line 502, as compared with data values 0, 0, 5, and 7, it should be understood that 2 is greater than 0 in two instances and less than 5 and 7, respectively, in two other instances. Accordingly, compare values ("C[3 . . . 0]") for registers 421 through 424 respectively are 1, 1, 0, and 0, as generally indicated by line 505.

As indicated by lines 505 and 504 and arrows 513, compare values are provided as LSBs from registers 421 through 424 to registers 436 through 439, respectively. Additionally, compare results of line 505 are inverted to provide MSBs for register 433 as generally indicated on line 504 and as indicated by arrow 506. The LSB, or bit 0, is a logic 1, a fixed value, for register 433, as bit 0 of register 433 is always initialized with a logic 1 to indicate a self-comparison result. For example, two compared with two using a greater or equal operator in this example would always yield a logic 1, as generally indicated by logic 1 507 in line 504.

Bit sums for each of registers 433 and 436 through 439 of line 504 are respectively indicated as 3, 5, 4, 2, and 1 in line 508. This is simply a summing of the number of logic 1s in each of the aforementioned registers. A rank signal 314 input is shown in line 509. It should be appreciated that any of the values or positions of rank within rank order filter 304 may be used as a rank input, namely any of the numbers 1 through 5. However, for purposes of clarity by way of example and not limitation, it shall be assumed that the input value for rank is 3, as generally indicated in line 509, such as may be a median setting set by a user.

An equivalence operation between bit sums of line 508 and rank of line 509 indicates which data position is of a target rank. Accordingly, because this is a one-hot operation, only one of bit sums of line 508 will match a rank input of line 509 as generally indicated in line 510. In other words, the input to converter 450 of FIG. 4 ("CONVERT_IN[4:0]") is a one-hot input, meaning only one of the CONVERT_IN[4:0] bits is a logic 1. For purposes of clarity and not limitation, not each and every clock cycle and data state is illustratively shown in FIG. 5 for operation of filter core 304; however, in actuality there may be clock cycle latency between new data registered in register stage 410 and ultimately shifted out of register stage 430.

It should be appreciated that a new data point entering a filter core pipeline is compared with other values populating the filter core. Setting aside clock cycle latency, it should be understood that data positions between register stages 410 and 430 respectively correspond to one another. Thus, third stage registers 430 in effect store how many data samples in the pipeline of filter core 304 have a larger value than the data samples stored in such third stage registers 430. For example, CR[2] register 438 stores in a parallel implementation how many data samples are in filter core 304 that are larger than data in data position 2, namely register D[2], for a given clock cycle. Moreover, for example, CN register 433 stores in a parallel implementation how many data samples are in filter core 304 that are larger than data in data position new, namely register ND, for a given clock cycle.

To process pictures or images, 2D data is conventionally used. Accordingly, filter core 304 of FIG. 3 may be used to process WH new samples and generate one new output sample per clock cycle of system clock signal 330. Thus, for example, for a 75 MHz pixel clock frequency for HDTV running at a pixel resolution of 1920 by 1080 ("1920×1080"), a filter core using a 4-by-3 pixel window may be operated at 75 MHz multiplied by 3, or 225 MHz. Accordingly, a 4-by-3 TAP filter may be configured to register three input samples per system clock 330 cycle to provide a single filter output per pixel clock cycle for digital video processing. However, for filters with a larger number of TAPs, multiple samples may have to be processed in each clock cycle of a system clock 330 to increase throughput. Thus, filter core 304 of FIG. 3 may be extended to process more than one new sample per system clock cycle.

Filter core 304 rather than processing one input sample at a time may be configured to process WH samples, which in the above 4-by-3 pixel example is 3 pixels input in a single clock cycle. Continuing this example, there would be 3 sets of each of stages 410, 420, 425, and 430. For example, there would be three sets of each of register stages 410 through 430, wherein each of register stages 410 and 430 would be NTAP registers, which in this example is 12 registers. Moreover, there would be three comparison stages 425. However, after register stage 430, there are not multiple iterations of stages, but rather one stage for summing bits and comparing against a rank for a one-hot output to generate an address. Suppose for this example, the host FPGA had a maximum frequency of 160 MHz and the pixel clock rate was 75 MHz, then only overclocking at 225 MHz without any parallel circuitry implemented would not be an option. Thus, a parallel implementation in addition to overclocking, namely clocking faster than a sampling frequency, $f_s$, may be used. For example, a clock rate of 150 MHz may be used with some parallel processing in a hybrid rank order filter implementation, as described below in additional detail. However, it should be understood that a maximum clock frequency may be determined for an implementation in order to conserve circuit resources. This may be thought of as a solution space that operates at the highest available frequency with the least amount of resources.

The number of samples processed per a system clock cycle may be controlled by the parameter NI. In order to process NI samples at a time, data registers and CR shift registers shift by NI data positions. The number of comparators is thus multiplied proportionally for comparing previously stored samples with newly stored samples, and comparing newly stored samples with each other.

If WH is not an integer multiple of NI, throughput of filter core 304 input may supersede that of an input stream to filter core 304, as described below in additional detail. Accordingly, in some clock cycles of system clock signal 330, the number of valid new data samples may be less than NI. The actual number of available new input samples may change for each clock cycle of system clock signal 330. Numerous multiplexers may be inserted into datapaths to address processing a dynamically changing number of new samples, or padding samples may be inserted.

Padding samples may be inserted such that for every clock cycle of system clock signal 330, exactly NI new samples enter filter core 304. The number of padding samples to add is as follows:

$$\left[\frac{WH}{NI}\right]NI - WH, \tag{6}$$

where the brackets [ ] denote a rounding up operation. Padding samples may be added to every filter column such that a rank order filter uses a virtual filter window having a virtual vertical size, $WH_v$, which may be identified as:

$$WH_V = \left[\frac{WH}{NI}\right]NI, \tag{7}$$

where the brackets [ ] denote a rounding up operation. The number of comparators for an NTAP-size filter with NI new samples may be found from:

$$C = (NTAP - NI)NI + \left[\frac{NI(NI-1)}{2}\right], \tag{8}$$

where the brackets [ ] denote a rounding up operation. Thus, a hybrid rank order filter may be implemented where a minimum number of NI samples per pixel clock cycle is selected in order to obtain high operating frequencies with relatively low circuit resource usage.

Again, if WH is not an integer multiple of NI, the width of filter core 304 may be exceeded for an NI input. In other words, if WH is not an integer multiple of NI, then for an input of NI samples on a clock cycle, a portion of such NI samples may be outside the range of WH. Accordingly, as indicated above, in some clock cycles, the number of valid new data samples is going to be less than NI. For example, for a 7-by-7 pixel filter window, with NI equal to 3 and $f_C$ equal to $3f_S$, there are seven new input values to enter a filter core in three filter core clock cycles. In the first two of these three filter core clock cycles, new samples may be provided respectively, but in the third filter core clock cycle only one new sample is available. The virtual aperture size of this filter is thus 7-by-9 pixels.

In short, padding samples may be added such that in every system clock cycle, NI new samples are entered into filter core 304. Again, because this inserts ($WH_V$–WH) padding samples into the filter in every filter column, as indicated by the above Equation (7) for $WH_V$, height of the filter window is a virtual height.

Alternatively, a rank order filter may be configured to be capable of processing a dynamically changing number of new samples by inserting multiplexers into the appropriate datapaths in front of data and CR shift registers. In one scenario, all NI filter inputs may access valid input samples, such as from the middle of a column of a filter window; alternatively, in another scenario, there are only WH modulo NI valid inputs available, such as from the bottom of a column of a filter window. Two-to-one multiplexers may be implemented to accommodate the two different scenarios, and WH input samples may be entered into the filter with NI inputs in subsequent clock cycles. Even though the size of multiplexers may be limited to 2:1, numerous multiplexers may be implemented to facilitate dynamic shifting.

Figure 6A:
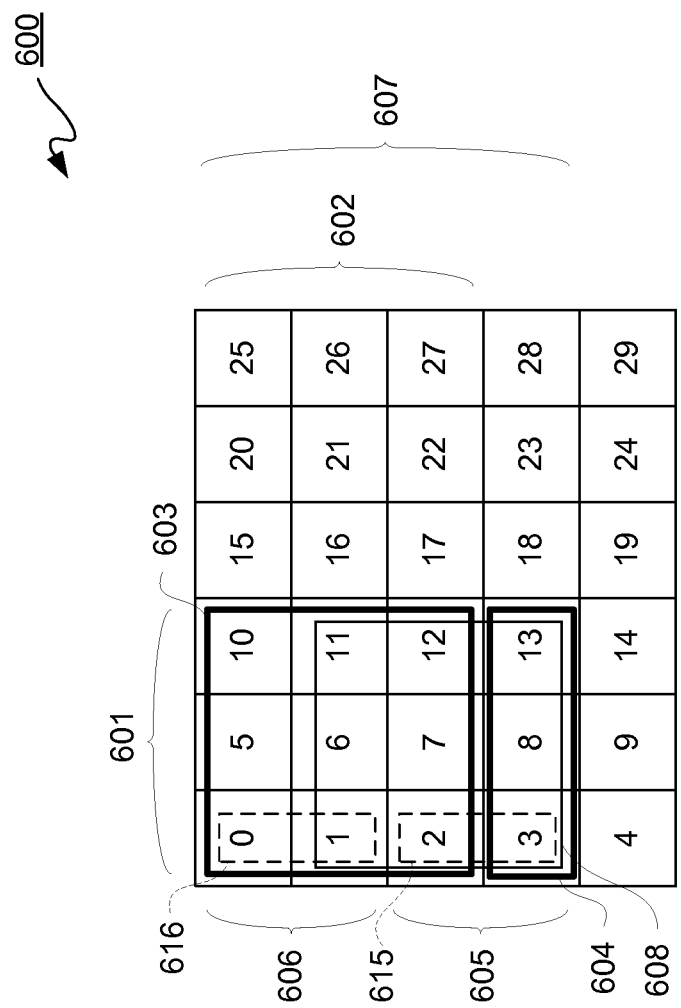
FIG. 6A is a block diagram depicting an exemplary embodiment of a virtual window for a portion of an image.

FIG. 6A is a block diagram depicting an exemplary embodiment of a virtual window for a portion of an image 600. In this portion of an image 600, there are 30 pixels numbered from 0 to 29. In this example, a 3-by-3 window 603 is used, or WW 601 and WH 602 are each equal to 3. Two sets of NI samples 605 and 606 each, where NI is equal to 2, are clocked into a filter core, such as filter core 304 of FIG. 3. In this example, NI samples 606 and 605 are respectively clocked into the filter core on separate consecutive clock cycles. For example, in a first clock cycle, a set of pixels, as indicated by dashed box 616 ("set 616") are inserted, and in a second clock cycle, a set of pixels, as indicated by dashed box 615 ("set 615") are inserted. Samples from set 616 are all valid samples; however, samples from set 615 are not all valid, because some of the samples for set 614 are outside of window 603. Padding samples as indicated by box 604 are part of sample set 615, facilitating the insertion of two pixels per clock cycle. $WH_V$ 607 is thus the combined height of 606 and 605. Thus, WW 601 by $WH_V$ 607 defines a virtual filter window.

Figure 6B:
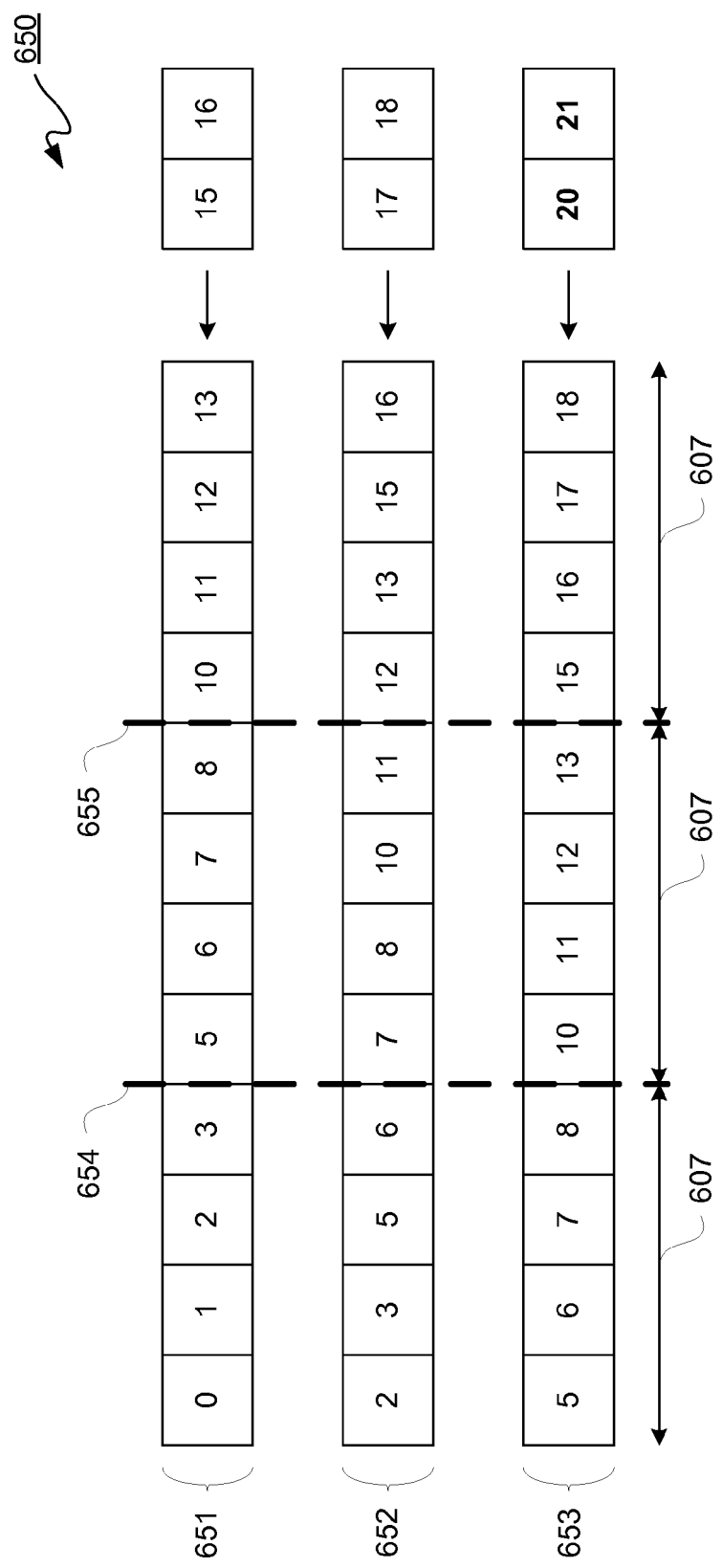
FIG. 6B is a block diagram depicting an exemplary embodiment of a pixel register data flow for the example of FIG. 6A.

FIG. 6B is a block diagram depicting an exemplary embodiment of a pixel register data flow 650 for the example of FIG. 6A. With reference to FIGS. 4, 6A and 6B, pixel register data flow 650 is further described. All data registers may contain both valid and padding samples during operation. Comparisons are done using all data registers irrespective of whether a sample is valid or not. Therefore, filter core 304 of FIG. 3 and, in particular, comparators thereof scale with the size of the virtual filter window, and in particular $WH_V$ 607.

Padding samples may be masked out prior to counting comparator results. In other words, padding samples may be masked out at the CR shift registers before sending out bits of comparator results. Furthermore, a circular shift register may be used for generating mask values. A punctured (non-convex) filter window may be used, although masking may become significantly more complex with a puncture filter window For each older sample, masking may be done for two sets of NI bits each. One set of these NI bits is for masking comparison results with NI new samples, and another set of these NI bits is to mask comparison results for discarded samples according to CR(NTAP-1:NTAP-NI). Masking values change according to validity of new samples.

In FIG. 6A, for a clock cycle at time T a masking value of 11 is used, and at a clock cycle of T+1 a masking value of 10 is used. Generally, the masking value may be all 1s, namely 1 . . . 1, except for last cycles of a virtual filter window column. For the last column of a virtual filter window, a masking value may be generated for clock cycles associated with such last column according to:

mask_old={C1(*NI–NZ*),C0(*NZ*)}, for *NZ=j=WH<sub>v</sub>–WH*; and     (9)

mask={mask_new<<*NI*,mask_old},     (10)

where C1(NI–NZ) denotes an (NI–NZ)-bit wide set of 1s, and C0(NZ) denotes an NZ-bit wide set of 0s. All bits of NTAP-bit wide registers of new samples may be masked as register contents may change from clock cycle to clock cycle. Mask value is periodic with $WH_V$ and may be generated by a shift register as indicated in FIG. 6B, where data register contents for clock cycles 651, 652, and 653 are illustratively shown. Clock cycle 651 may be thought of at time T; clock cycle 652 may be thought of as at time T+1; and clock cycle 653 may be thought of as at time T+2, where T+1 is one clock cycle later than time T, and T+2 is two clock cycles later than time T.

At clock cycle 651, pixels 0 through 3 are in one column of a virtual filter window, and the other two columns in the example of FIG. 6A have pixels 5 through 8 and 10 through 13, respectively. Dashed lines 654 and 655 delineate that these columns of pixels are being processed in separate sets of data registers, though during the same clock cycle. Furthermore, as indicated on a subsequent clock cycle from clock cycle 651, namely clock cycle 652, pixels 15 and 16 are to be shifted in.

As indicated for clock cycle 652, contents of data registers for a first column of a virtual filter window are pixels 2, 3, 5, and 6, and pixels 0 and 1 have been shifted out. The remaining shifting follows as indicated, where pixels 15 and 16 are shifted in at clock cycle 652, and pixels 17 and 18 remain to be shifted in at clock cycle 653. As indicated for clock cycle 653, pixels 17 and 18 are shifted in, and pixels 2 and 3 are shifted out. Pixels 20 and 21 are to be shifted in on a next clock cycle (not shown).

Notably, it has been assumed that a rectangular filter window is used. However, if sample masking is done not only on new samples but also on all NTAP registers, arbitrary window shapes may be used, as shift register contents may be masked and unmasked from clock cycle to clock cycle of a system clock signal 330 of FIG. 3. As a mask value may be periodic with WH and may be generated by a shift register, non-rectangular shapes may be used.

Bit-sum calculations, however, become more complex for non-rectangular shapes due to an increased number of possible transitions between adjacent compare results stored as CR shift register values. Architectural complexity for non-rectangular filter windows may be reduced by having a mask that is circular or convex. Once valid and invalid samples are distinguished by a mask, which may change each time a filter window is shifted by at least one pixel, non-rectangular apertures may be filtered as well. Virtual window size may be viewed as a number NZ+1 of non-virtual filter windows joined together, where NZ is equal to ($WH_V$–WH). Accordingly, by inserting valid samples affected by a virtual window sampling and using the same number of comparators as previously described, all comparison information may be available to generate NZ+1 outputs instead of only one output.

Apart from bit masking, bit summing for new samples may be different from the 1D example of FIG. 3, namely an adder tree may be used to add the number of bits. Counter-based bit summing for the least recent samples may get more complex as NI increases, because the modification value extended from the (–1, 0, +1) to the (–NI . . . +NI) range. The modification value for bit-summer index q may be computed as:

$$\sum_{b=0}^{NI-1} C(q)(b) - \sum_{t=0}^{NI-1} CR(q)(NTAP-1-t). \quad (11)$$

The index q denotes which stage (e.g., comparator, shift register, or bit summer) is being considered. Depending on the number of padding samples inserted, certain filter configurations may become prohibitively large. It should be appreciated that the complexity of a filter core is proportional to NI and virtual filter size.

Figure 7:
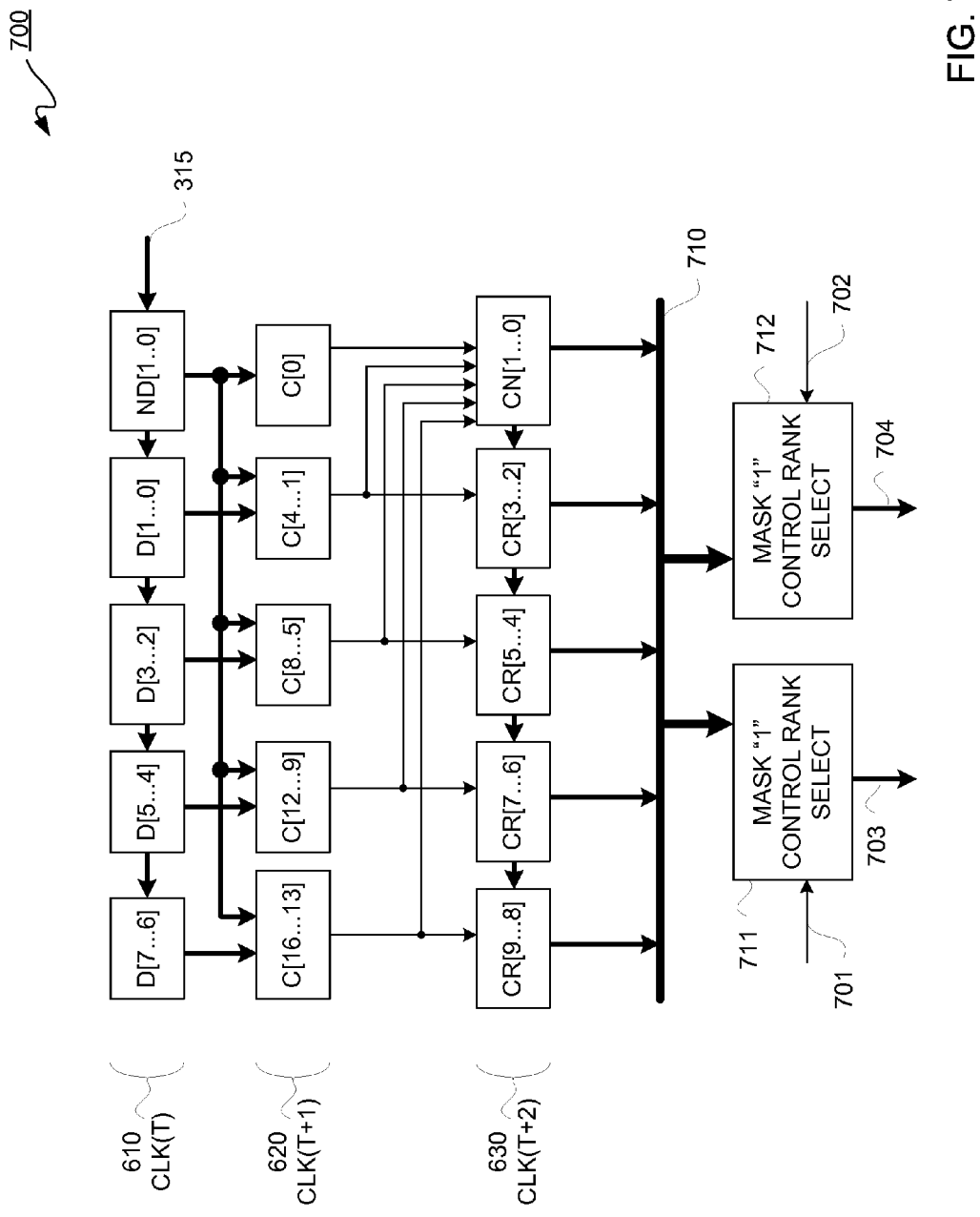
FIG. 7 is a block diagram depicting an exemplary embodiment of a filter core architecture for generating multiple, namely NZ+1, outputs at a time.

FIG. 7 is a block diagram depicting an exemplary embodiment of a filter core architecture 700 for generating multiple, namely NZ+1, outputs at a time. In other words, interim outputs may be generated. For example, for $WH_v/NI=2$, it may take two clock cycles to generate an output. However, by generating interim outputs, two outputs may be generated in three compare clock cycles, namely an output for region 603 of FIG. 6A in clock cycle 2 and an output for region 608 of FIG. 6A in clock cycle 3. Thus, a 3 to 2, rather than a 2 to 1, clock cycle to output ratio may be provided, as described below in additional detail.

In this example, input 315 may be new data locations [1 . . . 0], where [1 . . . 0] generally indicates input sample index 0 and 1. In a first register stage 610, data is shifted in as previously described with respect to FIG. 3, though with multiple inputs. As previously described, these multiple inputs can be compared with the new data and stored in a second register stage 620. It should be appreciated that for an FPGA implementation, registers may exist as part of CLBs, and such CLBs may be configured to include comparators (not shown in FIG. 7 for purposes of clarity). Accordingly, each of the blocks illustratively shown in FIG. 7 may be considered a CLB having registers, as well as other logic to implement functions described herein. Output from second register stage 620, which includes an additional register stage in comparison to filter core 304 of FIG. 4, may be provided as individual bits of compare results to a CN register for data locations 1 . . . 0. The MSBs may be shifted as previously described in FIG. 4 from one register to another of third register stage 630, and the output of register stage 630 may be bused to bus 710 for input to mask "1" control rank select blocks 711 and 712.

Input to mask control rank select block 711 may be mask data window select 701, and input to mask control rank select block 712 may be mask data window select 702. Mask data window selects 701 and 702 may be used to switch between different masks applied to the same data window. Mask control rank select block 711 may be used to generate an address 703, and mask control rank select block 712 may be used to generate an address 704.

NZ different masks may be generated and stored in circular shift registers of filter core architecture 700. Additionally, though not shown in detail for purposes of clarity and not limitation, filter core 700 may implement logic 1 counters and ranking logic which are replicated NZ times. Operating frequency of filter core 700 may be determined by:

$$f_c = \frac{\left\lceil \frac{WH}{NI} \right\rceil}{\left\lceil \frac{WH}{NI} \right\rceil NI - WH + 1} f_s, \quad (12)$$

where the brackets [ ] denote a rounding up operation.

Notably, multiple filters, and thus multiple filter cores, may be operated in parallel for adaptive filtering applications. For example, an adaptive filtering application may involve the result of one filter variant being dynamically selected based on one or more a posterior metrics. For example, there may be different filter window shapes stored, and based on the quality of results to be obtained, an application may choose among these filter window shapes.

To compensate for the difference between a display sequence and data generation sequence, a line buffer may be coupled to the output of a rank order filter in which filter core 700 is implemented. This may be used to accommodate a multiple-output implementation used to generate two output samples in three clock cycles. Continuing the example with reference to FIGS. 6A and 6B of a 3-by-3 pixel filter window with NI equal to 2, the virtual filter window is 4 rows of pixels by 3 columns of pixels. So in clock cycle 1, two samples may be latched by the filter core. In clock cycle 2, two more samples may be latched by the filter core, and a result may be calculated based on masking out the last row. In clock cycle 3, another result is generated masking out the first row and unmasking the last row. So two output pixels are generated in 3 clock cycles. However, output pixel 2, for example, is under pixel 1. If pixels are output in a row-continuous order, then every second output pixels, namely the lower set of pixels, is stored in a line buffer, and every first output of pixels, namely the upper set of pixels, is output. When, for example, the right end of a line or row is reached, processing may be paused while the line buffer contents are fed to the output. When the line buffer is emptied, scanning the image from left to right may begin again, but incremented down one row. More than one line buffer may be used to facilitate balancing out pauses in processing to operate at a lower than average system clock rate.

It should be appreciated that a rank order filter architecture as described herein may be used to implement filter windows with integer-weighted pixels. It should be appreciated that filter core architecture 700 may be used to alter filter core 304 of FIG. 4 for use in rank order filter 300 of FIG. 3. Integer-weighted pixels may be useful for applications where a filter aperture may have non-uniform, differential sensitivity. To implement a weighted window, output bits of a CR shift register of a filter core may be replicated according to:

$$CR_w[k] = \{w(i)\{CR[k](i)\}\}, 0 \le i, k \le NTAP-1, \quad (13)$$

where $CR_w[k](i)$ denotes the ith bit of a non-weighted $CR[k]$ pixel data value, the integer $w(i)$ denotes the weight of the pixel i in a filter window, and { } denotes concatenation. Alternatively stated, replication of weighted window output bits may be such that all $CR_w[k]$ outputs are equal to width W, where:

$$W = \sum_{i=0}^{NTAP-1} w(i); \text{ and} \quad (14)$$

bit-sum values of $CR_w[k]$ range from 1 to W, because for W≥NTAP not all integer values between 1 to W may be present at the outputs of bit-sum calculations. Rank comparator modules may be modified in order to select the correct sample when no bit-sum calculator output matches the selected rank value exactly.

Figure 8:
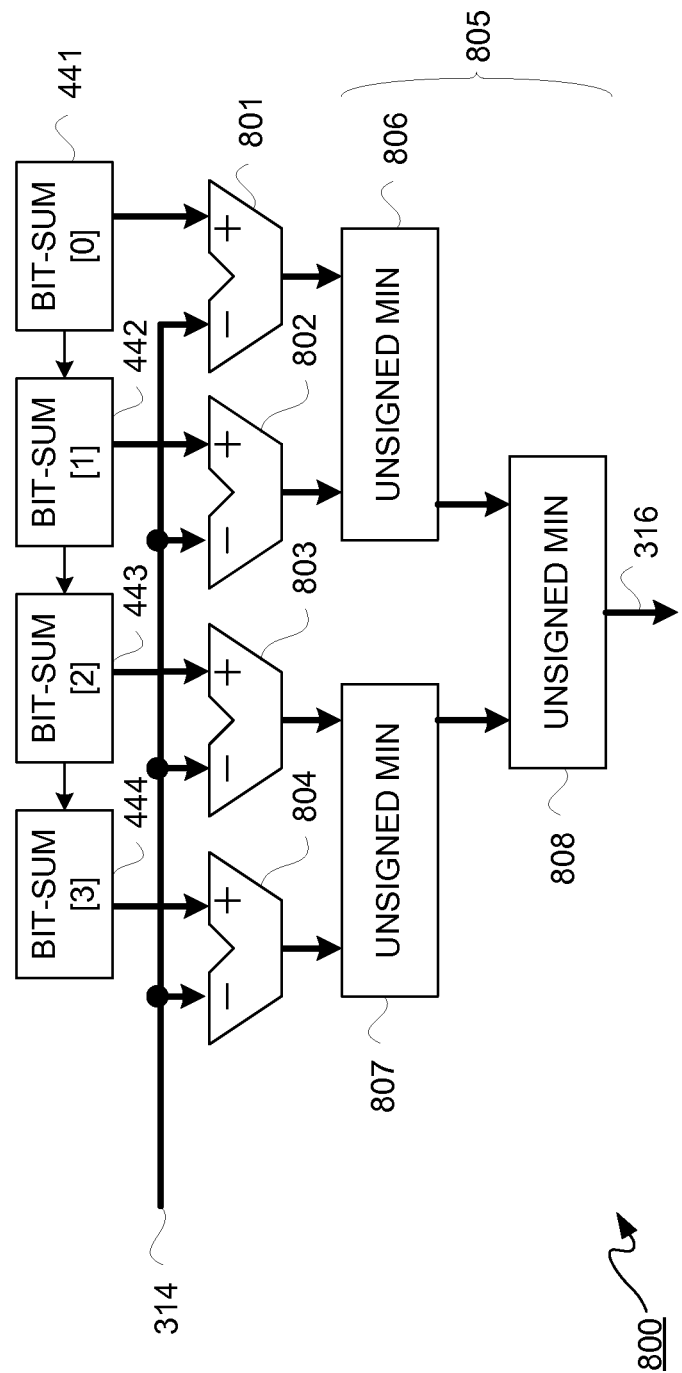
FIG. 8 is a block/circuit diagram depicting an exemplary embodiment of a portion of a filter core configured to subtract rank from bit-sum values.

FIG. 8 is a block/circuit diagram depicting an exemplary embodiment of a portion of a filter core 800 configured to subtract rank from bit-sum values. Notably, for purposes of clarity, not all of filter core 800 is illustratively shown. A filter core 304 of FIG. 3 may be used to add in that which is not shown in FIG. 8, except in this example there is one less bit summer block. However, it should be appreciated that filter core 800 may be used to replace filter core 304 in rank order filter 300 of FIG. 3.

In this example, outputs of bit-sum blocks 441 through 444 are respectively provided to plus ports of absolute differentiator 801 through 804. A rank value from rank signaling 314 is provided to minus ports of absolute differentiators 801 through 804. A tree structure 805 is used to find minimum differences of outputs from absolute differentiators 801 through 804. In particular, outputs from absolute differentiators 801 and 802 are provided to unsigned minimum block 806, and outputs from absolute differentiators 803 and 804 are provided unsigned minimum block 807. Outputs of unsigned minimum blocks 806 and 807 are provided as inputs to unsigned minimum block 808 to produce address 316.

All two-input minimum calculators of unsigned minimum blocks 806 through 808 may be configured to select the smaller of the inputs respectively provided to such unsigned minimum blocks 806 through 808. Samples may be assigned a tag, which may be used to form an address at the root of tree structure 805. As a sample propagates through the minimum selector provided by tree structure 805, a corresponding tag may be appended with a 0 or a 1 depending on whether the input was forwarded from the left or the right branch, respectively, of the unsigned minimum block. At the root of the tree structure 805, which is a binary tree, the tag may represent a desired address of the sample provided by rank signaling 314.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A rank order filter, comprising:
   the rank order filter being associated with a virtual filter window, the virtual filter window being a number NZ+1 concatenated real filter windows;
   the number NZ+1 being a height of the virtual filter window minus a height of the real filter windows, wherein each of the real filter windows are of a same dimension;
   a filter core including a stage of data registers, a stage of comparison blocks configured for registering compare results, and a stage of shift registers;
   the virtual filter window configured for input of an integer multiple of NI samples to the filter core;
   the filter core configured for input of the NI samples on a clock cycle of a filter core clock;
   wherein the filter core inputs the integer multiple of the NI samples for a number of clock cycles of the filter core clock, the number of the clock cycles being equivalent to the integer multiple;
   wherein the virtual filter window spans padding samples, the padding samples capable of being part of the NI samples;
   wherein the NI samples are capable of including both real samples and the padding samples, the real samples being associated with actual pixel information; and
   the filter core configured to make available all of the compare results for the stage of shift registers for generating NZ+1 outputs on each clock cycle of the filter core clock.

2. The rank order filter according to claim 1, wherein NZ different masks are generated for masking out from the stage of shift registers shift register results associated with the padding samples.

3. The rank order filter according to claim 2, wherein the NZ different masks are stored in circular shift registers.

4. The rank order filter according to claim 1, wherein the real samples are integer-weighted pixels.

5. The rank order filter according to claim 4, wherein shift registers of the stage of shift registers are replicated a number of times responsive to integer weighting of the integer-weighted pixels.

6. The rank order filter according to claim 5, wherein:
   rank input to the filter core is subtracted from respective bit sums determined from shifter register results of the stage of shift registers to provide respective differences; and
   the rank order filter further comprises a tree structure to determine a minimum of the differences.

\* \* \* \* \*